United States Patent

Guajardo

[15] 3,689,907

[45] Sept. 5, 1972

[54] DEWPOINT MONITOR

[72] Inventor: Ciro Guajardo, Harbor City, Calif.

[73] Assignee: Robbins Aviation, Inc., Vernon, Calif.

[22] Filed: Aug. 3, 1970

[21] Appl. No.: 60,365

[52] U.S. Cl. ....................340/235, 73/17 A, 317/146, 331/158

[51] Int. Cl. ..............................................G08b 21/00

[58] Field of Search ......340/235, 234; 73/17, 29, 23; 328/61; 324/79; 310/8.1; 317/146; 331/155, 158

[56] References Cited

UNITED STATES PATENTS 2,536,111 1/1951 Van Dyke ...............73/29 UX 2,593,204 4/1952 Schwartzberg............340/213

*Primary Examiner*—John W. Caldwell
*Assistant Examiner*—Daniel Myer
*Attorney*—Forrest J. Lilly

[57] ABSTRACT

A monitor for compressed air and other gases signaling the moisture level thereof relative to a predetermined dewpoint. The basic sensor is a piezoelectric quartz crystal coated with a hygroscopic material which adsorbs moisture and changes the overall mass of the crystal and its oscillating frequency. This frequency is compared to the frequency of a reference crystal oscillator and the difference frequency is operated on in an electronic circuit to signal the moisture content of a compressed gas relative to the predetermined dewpoint.

9 Claims, 3 Drawing Figures

INVENTOR.
CIRO GUAJARDO
BY Forrest J. Lilly
ATTORNEY

PATENTED SEP 5 1972

3,689,907

INVENTOR.
CIRO GUAJARDO
BY Forrest J. Lilly
ATTORNEY

DEWPOINT MONITOR

BACKGROUND OF THE INVENTION

This invention lies in the field of electronic dewpoint monitors using as a humidity sensor a piezoelectric crystal coated with a hygroscopic material.

The use of piezoelectric crystals coated with hygroscopic material as humidity sensors is old in the art. The crystal controls the frequency of an oscillator and as its hygroscopic coating adsorbs moisture, the overall mass of the crystal changes and with it its oscillating frequency and the frequency output of the oscillator. This use of the changing oscillating frequency of a piezoelectric crystal sensing element whose mass increases is shown in the patents to Van Dyke U.S. Pat. No. 2,571,171 and King, Jr., U.S. Pat. No. 3,164,004.

It is further known in the art to compare the variable frequency of a humidity responsive piezoelectric crystal controlled oscillator with a reference frequency and to utilize the beat or difference frequency signal. Such systems are shown in the patents to King, Jr., U.S. Pats. Nos. 3,260,104, 3,266,291, and 3,427,864 and also in the patents to Michael, U.S. Pat. No. 3,385,100 and Sanford et al., U.S. Pat. No. 3,431,770.

The dewpoint monitor of the present invention employs as its humidity sensor a piezoelectric quartz crystal coated with a hygroscopic material and controlling the frequency of an oscillator which changes with change in humidity and in the mass of the coated crystal. This varying frequency is compared to the frequency of a reference oscillator to secure the beat or difference frequency. The difference frequency is operated on in a highly sensitive electronic circuit capable of detecting variations in moisture content of as little as 50 parts or less per million at a pressure of 3,000 psi.

SUMMARY OF THE INVENTION

The humidity sensor of the present invention employs a piezoelectric quartz crystal coated with a hygroscopic material which adsorbs moisture to change the overall mass of the crystal and its oscillating frequency. This crystal controls a humidity sensor oscillator having an output frequency, by way of example only, of approximately 10.6 MHZ when dry. Various hygroscopic coatings may be employed and, by way of example only, is that resulting from a slurry of molecular sieve (formed from a crystalline substance such as zeolyte), hydrolyzed polyvinyl alcohol, ethyl acetate and water. The molecular sieve has a selective affinity for water vapor and is a prime hygroscopic element in the coating. The polyvinyl alcohol serves as a binder and is itself hygroscopic. The ethyl acetate is used to increase the conductivity of the slurry, evaporates completely after the slurry is applied as a coating to the crystal, and has no function other than to insure a homogenous slurry.

A reference oscillator is employed which has an output with a frequency, in the example given, typically 10 MHZ. The outputs of the humidity sensor oscillator and the reference oscillator are mixed to secure the difference frequency, typically 6 KHZ in the dry condition. This difference frequency is filtered and passed through a limiter circuit to square the wave form and eliminate any effect on amplitude change. The output of the limiter controls an adjustable, one shot multivibrator whose time interval between pulses is adjusted to coincide with the width of the difference frequency pulse at a predetermined tripping dewpoint, for example −80°F to which the system monitors.

The outputs of the limiter and the multivibrator are fed to an AND gate which conducts only under "wet" gas conditions where the duration of the beat frequency pulses is longer than the time interval of the multivibrator so that the pulses overlap.

The output of the AND gate feeds into an integrator whose output is connected to a threshold detector which gives an output only for those signals which have acquired the proper level in the integrator circuit. The output of the threshold detector is then fed to an inverter.

The output of the inverter divides, with one path forming one input to a NAN gate and the other controlling a silicon controlled rectifier (SCR) which in turn controls a signal indicating a "dry" condition of the gas being monitored, in the example given, a dewpoint below −80°F.

A clock which may have an output, for example, of 2 HZ also serves as an input to the NAN gate whose output controls an SCR which in turn controls a signal of a "wet" condition of the gas being monitored. The operation of the circuit is such that when the threshold detector has an output the inverter has no output whereby the "dry" signal is cut off and the "wet" signal initiated, a condition which occurs at the predetermined dewpoint, in the example given, −80°F.

With the use of the 2 HZ clock, a flashing or intermittent signal of the "wet" condition is given. By omitting this clock, a continuous signal may be secured, either from a gate operating as a second inverter or with the SCR for the "wet" signal controlled directly by the output of the threshold detector.

The humidity responsive, coated crystal operates from the direct process air or gas stream without resorting to control sampling techniques and at an air pressure of the order of 2,600–3,000 psi. The installation is thus relatively simple and does not require the use of exotic hardware and controls normally required in gas sampling devices. Other objects and features of the invention will be apparent from the detailed description.

DESCRIPTION OF THE PREFERRED EMBODIMENTS

Figures 1, 2:
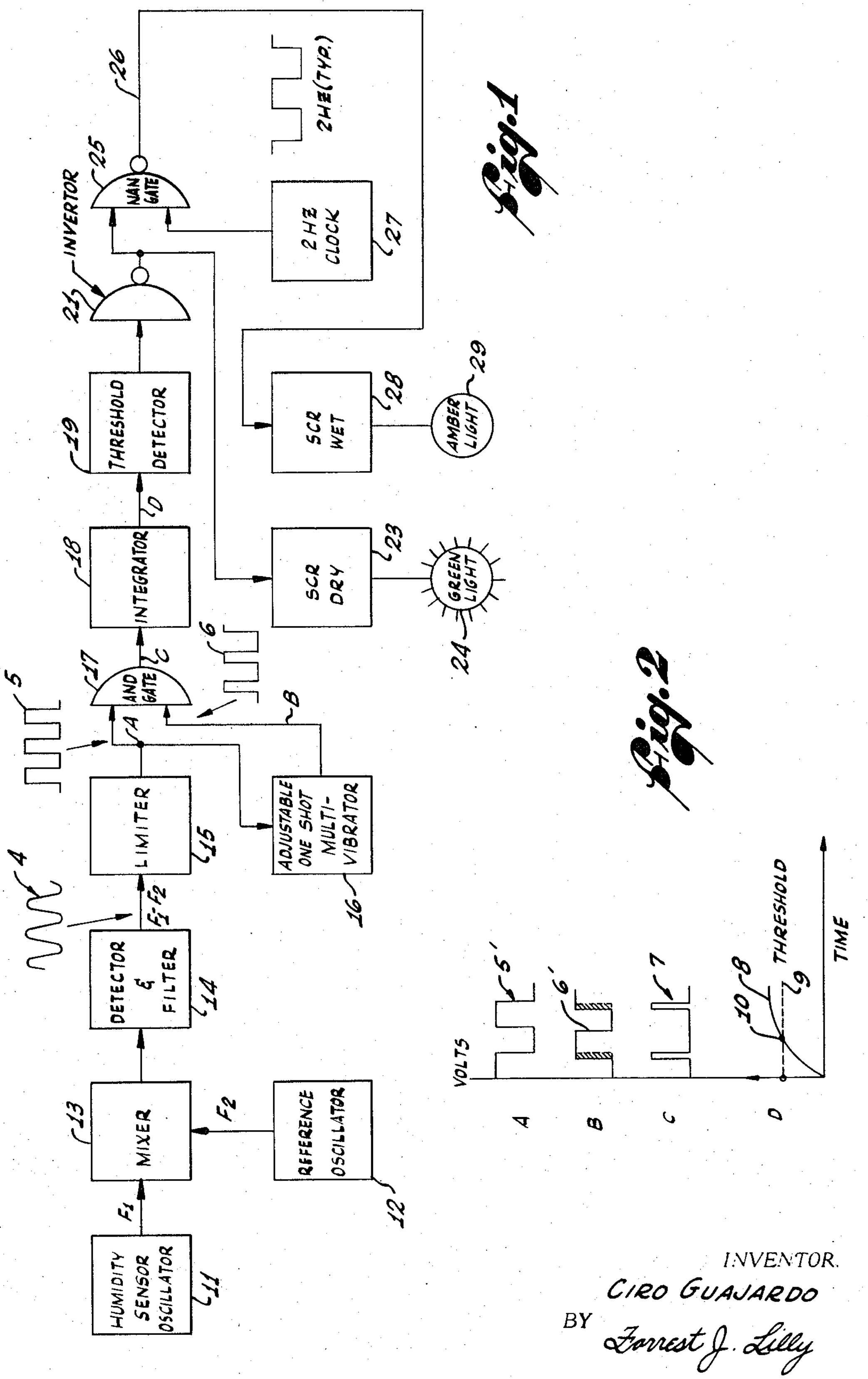
FIG. 1 is a block diagram showing the equivalent logic circuit of the dewpoint monitor of this invention.
FIG. 2 represents the operating valves of various points in the system under "wet" conditions.

The block diagram logic circuit of FIG. 1 shows the dewpoint monitoring system operating in the "dry" state with a difference frequency of about 6 KHZ corresponding to a dewpoint condition of approximately −105°F. The humidity sensor oscillator is shown at 11 and employs a piezoelectric crystal having a hygroscopic coating such as previously exemplified. In the "dry" condition this crystal has a resonant frequency giving an oscillator output, by way of example, of substantially 10.6 MHZ, indicated in the drawing as the humidity sensor oscillator frequency $F_1$. The humidity sensor crystal is coated, as previously exemplified, with molecular sieve and polyvinyl alcohol attained by coating the crystal with a slurry of molecular sieve, hydrolyzed polyvinyl alcohol, ethyl acetate and water with the latter two evaporating to leave the crystal with the hygroscopic coating of molecular sieve and polyvinyl alcohol.

A reference oscillator 12 has a fixed frequency output, in the example given, of substantially 10 MHZ, shown in the logic diagram as $F_2$. The output frequencies $F_1$ and $F_2$ of the two oscillators are combined in a mixer 13 and pass through a detector and filter 14 which filters out the individual frequencies and their sum, passing the beat or difference frequency, substantially 6 KHZ in the "dry" condition of the air or gas at a dewpoint of substantially −105°F. This difference frequency $F_1 - F_2$ is represented in FIG. 1 of the drawing at 4.

The difference frequency is passed through a limiter 15 to eliminate the effect of amplitude change and produce the square wave illustrated in FIG. 1 at 5, having the same frequency as difference frequency. The square wave output 5 of the limiter 15 is fed to an adjustable, one shot multivibrator 16 and as one input to an AND gate 17. The output of the multivibrator 16 is also fed to the AND gate 17. The leading edges of the pulses of the square wave 5 trigger the trailing edges or the start of the time interval between pulses of the output of the multivibrator 16. The intervals between the pulses in the output of the multivibrator are adjusted to substantially coincide with the width of the pulses of the square wave 5 at the predetermined tripping dewpoint, for example, −80°F. Therefore, for "dry" conditions with the dewpoint greater than −80°F, the time interval between the pulses from the multivibrator exceeds the width of the difference frequency pulses at 5 so that there is no output from the AND gate 17 since the input pulses thereto never overlap.

Under "wet" conditions where the dewpoint of the air or gas is above the predetermined example of −80° F, the difference frequency $F_1 - F_2$ becomes less, for example 5 KHZ, and the duration of the pulses of the square wave 5 exceeds the constant time interval between the pulses from the multivibrator 16, whereupon there is overlapping of the pulses feeding the AND gate 17 and it conducts during the overlap period to pass an input into an integrator 18.

FIG. 1 illustrates a "dry" condition of the gas being monitored where there is no output from the AND gate 17 and hence no input to the integrator 18 and, likewise, no input to a threshold detector 19 which, in turn, feeds to an inverter 21. Since there is no input to the inverter 21, it does have an output which is fed through line 22 to a silicon controlled rectifier ( SCR) 23 which conducts to illuminate a signal light, or the like, 24 to give an indication that the system is operating at a "dry" condition with the air or gas at a dewpoint lower than −80°F.

The output of the inverter 21 also forms one input to a NAN gate 25 which has an output over line 26 only when there are no inputs thereto. The other input to the NAN gate is from a clock 27 which transmits pulses, as shown, of a frequency, for example, of 2 HZ. The line 26 controls an SCR 28 which, in turn, controls a flashing or intermittent light 29 indicating a "wet" condition of the air or gas being monitored, as will be explained hereinafter. The points A, B, C, and D have been referenced on FIG. 1 of the drawing and the outputs thereat in the "wet" state are illustrated in FIG. 2.

As the humidity of the air or gas being monitored increases, moisture is retained in the hygroscopic coating of the humidity sensor crystal and its mass increases, while its resonant frequency decreases until the difference frequency $F_1 - F_2$ reaches a value of about 5 KHZ, substantially at the predetermined example dewpoint of −80°F. At this point the time intervals between the pulses from the multivibrator at point B are substantially equal in width to the width of the pulses in the difference of frequency square wave 5 at point A. As the dewpoint goes up, the pulse width at A becomes greater and exceeds the width of the interval between pulses at point B, as is illustrated at 5′ and 6′ in FIG. 2. This shows an overlap of the pulses at points A and B to produce an AND gate output at point C, indicated at 7 in FIG. 2. Pulses 7 are fed to the integrator 18, which has a time constant, for example, of approximately 2 seconds, and which also serves to eliminate any noise which might be present in the signal. The integrator output at point B takes the wave form shown at 8 in FIG. 2 which is fed to the threshold detector 19 having a threshold value indicated by the dotted line 9 which intersects the wave form 8 at the point 10, at which point the threshold detector 19 feeds to the inverter 21. Since the inverter 21 now has an input, it has no output, which de-energizes SCR 23 and extinguishes the "dry" condition indicating light 24. With no output to the NAN gate 25 from the inverter 21, this NAN gate conducts during the intervals between pulses from the clock 27 so that there is an intermittent output from the NAN gate 25 on line 26 at clock frequency or 2 HZ in the example given. This triggers SCR 28 so that it conducts intermittently at clock frequency to illuminate the light or other signal means 29 in a flashing or intermittent mode to indicate that the monitoring system has now detected a "wet" condition in the air or gas being monitored. This signals the operator to replace purifier cartridges or otherwise adjust the system to move it back into the desired dry condition where the dewpoint of the gas or air in contact with the sensing crystal is within the example range of −80°F down to −105°F or farther.

Figure 3:
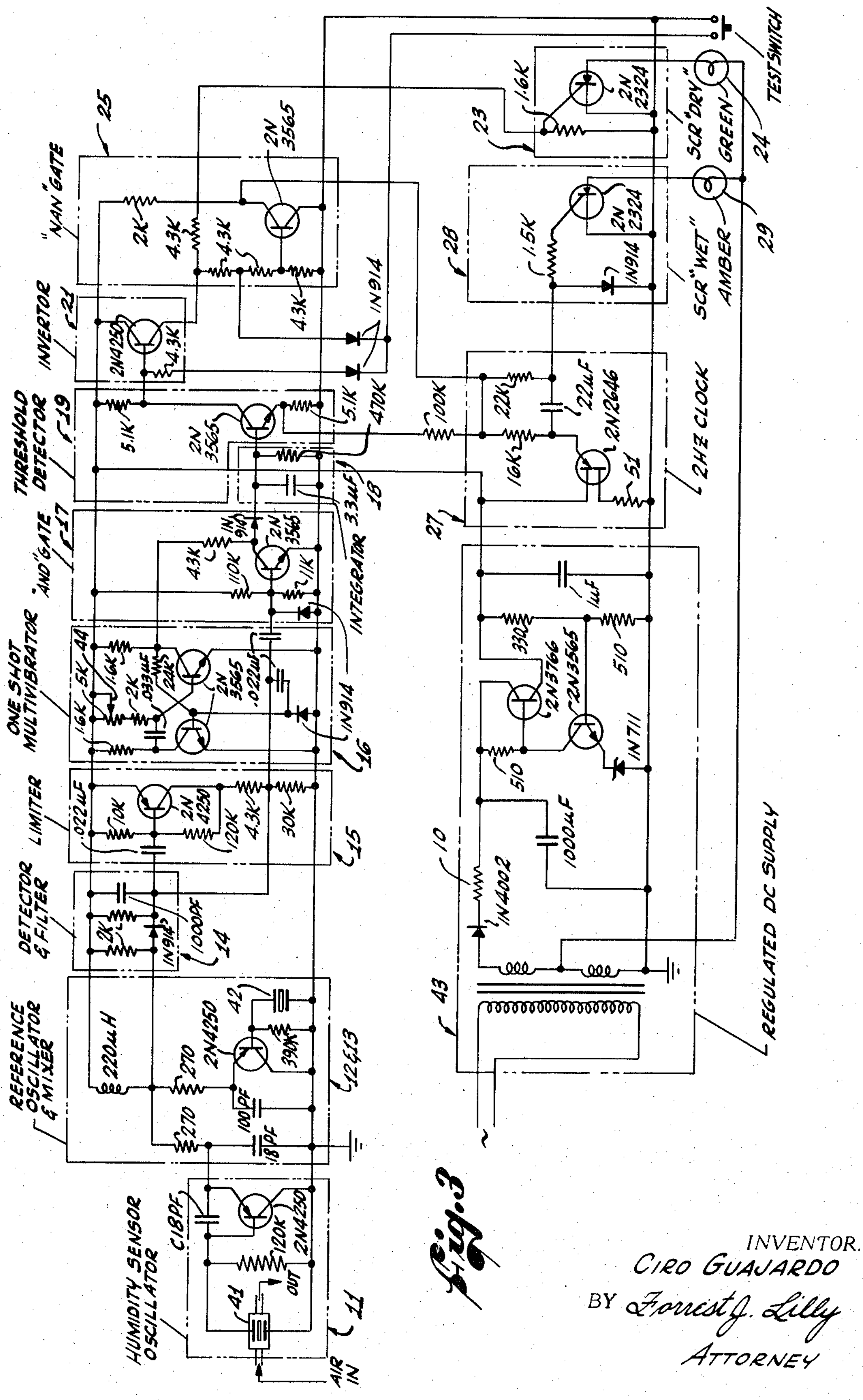
FIG. 3 is an exemplified line diagram of the dewpoint monitor with portions grouped to correspond generally to the blocks of the logic diagram.

FIG. 3 shows but one of many exemplary circuits which can be utilized to produce the logic of the block diagram of FIG. 1. Transistors, including a unijunction transistor, and diodes, including a zenerdiode, have been given their identification numbers. The values of the resistors are given as ohms and the capacitors in picofarads and microfarads, as identified, and the inductance of the mixer coil is given in microhenries. The silicon controlled rectifiers are also identified by number. All such values and identification and the circuit itself is by way of example only. The hygroscopic coated crystal of the humidity sensor oscillator is shown at 41 within a chamber through which air or gas at 2,600–3,000 psi is passed. The piezoelectric crystal of the reference oscillator is shown at 42.

The various block elements of the logic diagram of FIG. 1 have been outlined in FIG. 3 and given the same numerals. Also shown in FIG. 3 is a regulated DC supply at 43. The multivibrator 16 is adjusted to secure the desired constant interval, that is the width between pulses in the square wave 6, by the potentiometer 44.

It will be understood that the clock 27 may operate continuously or be connected to operate only when there is an output from the threshold detector 19. It will be further understood that if the light 29 is not to flash, the clock 27 may be omitted and the "wet" SCR 28 controlled directly by the output of the threshold detector 19; that is, when the threshold detector 19 has an output, the "wet" condition indicating light 29 will go on continuously and at the same time, since the inverter 21 will now have no output, SCR 23 will be nonconducting and the dry condition light 24 will go out. In this latter case the NAN gate 25 may be entirely omitted.

While certain preferred embodiments of the invention have been specifically illustrated and described, it will be understood that the invention is not limited thereto as many variations will be apparent from those skilled in the art and the invention is to be given its broadest interpretation of the terms of the following claims.

I claim:

1. A dewpoint monitor for gases comprising:

a first oscillator;

means responsive to humidity for controlling the frequency of the output of said first oscillator;

means subjecting said responsive means to contact with a gas being monitored;

a second oscillator having a substantially constant frequency output;

means for mixing said oscillator outputs to secure the difference frequency therebetween;

means for indicating a dry condition of the gas being monitored below a predetermined dewpoint;

means for indicating a wet condition of the gas being monitored above said predetermined dewpoint;

means responsive to said difference frequency for determining whether the gas being monitored is in a dry or wet condition and for actuating the appropriate indicating means for the condition determined;

said means responsive to said difference frequency including means for converting said difference frequency into a first square wave of the same frequency;

means for generating a second square wave of the same frequency as said first square wave and with a substantially constant interval between pulses, which interval is substantially equal to the pulse width of said first square wave at said predetermined dewpoint, the leading edges of said first square wave pulses coinciding with the trailing edges of said second square wave pulses; and an AND gate fed by said first and second square waves to indicate by the nonconduction or conduction thereof the dry or wet condition, respectively, of the gas being monitored.

2. The dewpoint monitor defined in claim 1 in which:

said means for generating the second square wave is a one shot multivibrator whose pulse is terminated by the leading edge of the pulse of the first square wave; and means for adjusting said multivibrator circuit to adjust its interval between pulses to the width of the first square wave pulse at said predetermined dewpoint.

3. The dewpoint monitor defined in claim 1 in which:

the widths of the first and second square wave pulses and their frequency change with change in the difference frequency while the interval between pulses of said second square wave remains constant, so that at dewpoints above said predetermined dewpoint the pulses of said square waves overlap to produce an output from said AND gate.

4. The dewpoint monitor defined in claim 1 including:

an integrator fed by said AND gate; and means responsive to a predetermined amplitude of the output from said integrator for actuating the appropriate indicating means.

5. The dewpoint monitor defined in claim 4 including:

an invertor fed by said amplitude responsive means, and means for actuating said means for indicating the dry condition of the gas being monitored when said integrator output amplitude is less than said predetermined amplitude and said invertor has an output.

6. The dewpoint monitor defined in claim 5 including:

means for actuating said means for indicating the wet condition of the gas being monitored when said integrator output amplitude is greater than said predetermined amplitude and said invertor has no output.

7. The dewpoint monitor defined in claim 6 including:

a NAN gate;

a pulse generating clock;

means feeding the outputs of said invertor and said clock to said NAN gate; and means actuating said wet condition indicating means by the intermittent NAN gate output between said clock pulses.

8. A humidity sensor comprising:

a first oscillator;

means responsive to humidity for controlling the frequency of the output of said first oscillator;

means subjecting said responsive means to contact with a gas being monitored;

a second oscillator having a substantially constant frequency output;

means for mixing said oscillator outputs to secure the difference therebetween;

means for converting said difference frequency into a first square wave of the same frequency;

means for generating a second square wave of the same frequency as said first square wave and with a substantially constant interval between pulses, which interval is substantially equal to the pulse width of said first square wave at a predetermined dewpoint of the gas being monitored; and means responsive to overlap and nonoverlap of said first and second square wave pulses to indicate the wet or dry condition of the gas being monitored relative to said predetermined dewpoint.

9. The humidity sensor defined in claim 8 in which said last mentioned means includes:

an AND gate fed by said first and second square waves;

an integrator fed by the output of said AND gate;

a threshold detector fed by said integrator; and means responsive to the reaching or nonreaching of the threshold of the detector for actuating the wet or dry condition indication.

* * * * *